United States Patent
Park et al.

(10) Patent No.: US 11,672,183 B2
(45) Date of Patent: Jun. 6, 2023

(54) MAGNETIC MEMORY DEVICE HAVING A FERROMAGNETIC ELEMENT

(71) Applicant: Samsung Electronics Co., Ltd., Suwon-si (KR)

(72) Inventors: Sang Hwan Park, Hwaseong-si (KR); Jae Hoon Kim, Seoul (KR); Younghyun Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 264 days.

(21) Appl. No.: 16/803,051

(22) Filed: Feb. 27, 2020

(65) Prior Publication Data
US 2021/0020829 A1    Jan. 21, 2021

(30) Foreign Application Priority Data
Jul. 19, 2019  (KR) .................. 10-2019-0087335

(51) Int. Cl.
| | | |
|---|---|---|
| *H01L 43/02* | (2006.01) | |
| *H01F 10/32* | (2006.01) | |
| *H01L 27/22* | (2006.01) | |
| *G11C 11/16* | (2006.01) | |
| *H01L 43/10* | (2006.01) | |
| *H01L 43/12* | (2006.01) | |

(52) U.S. Cl.
CPC .......... *H01L 43/02* (2013.01); *H01F 10/329* (2013.01); *H01F 10/3254* (2013.01); *H01F 10/3268* (2013.01); *H01F 10/3286* (2013.01); *H01L 27/228* (2013.01); *G11C 11/161* (2013.01); *G11C 11/1659* (2013.01); *H01L 43/10* (2013.01); *H01L 43/12* (2013.01)

(58) Field of Classification Search
CPC ....... H01L 43/02; H01L 27/228; H01L 43/10; H01L 43/12; H01F 10/3254; H01F 10/3268; H01F 10/3286; H01F 10/329; G11C 11/161; G11C 11/1659
USPC ..................................................... 257/421
See application file for complete search history.

(56) References Cited

U.S. PATENT DOCUMENTS

| | | |
|---|---|---|
| 6,775,111 B2 | 8/2004 | Lin et al. |
| 7,098,495 B2 | 8/2006 | Sun et al. |
| 7,948,044 B2 | 5/2011 | Horng et al. |
| 8,164,862 B2 | 4/2012 | Zhang et al. |
| 8,259,420 B2 | 9/2012 | Zhao et al. |
| 8,722,211 B2 | 5/2014 | Kim et al. |
| 9,171,601 B2 * | 10/2015 | Shukh ............... G11C 11/1675 |

(Continued)

FOREIGN PATENT DOCUMENTS

| | | |
|---|---|---|
| JP | 5599738 B2 | 10/2014 |
| KR | 10-2019-0036354 A | 4/2019 |

*Primary Examiner* — Jami Valentine Miller
(74) *Attorney, Agent, or Firm* — Harness, Dickey & Pierce, P.L.C.

(57) ABSTRACT

A magnetic memory device includes a reference magnetic structure, a free magnetic structure, and a tunnel barrier pattern therebetween. The reference magnetic structure includes a first pinned pattern, a second pinned pattern between the first pinned pattern and the tunnel barrier pattern, and an exchange coupling pattern between the first pinned pattern and the second pinned pattern. The second pinned pattern includes magnetic patterns and non-magnetic patterns, which are alternately stacked. The first pinned pattern is a ferromagnetic pattern consisted of a ferromagnetic element.

17 Claims, 11 Drawing Sheets

(56) References Cited

U.S. PATENT DOCUMENTS

| | | | |
|---|---|---|---|
| 9,825,216 B2 | 11/2017 | Park et al. | |
| 2007/0092639 A1* | 4/2007 | Fuji | G11B 5/3932 |
| | | | 427/130 |
| 2012/0261777 A1* | 10/2012 | Shukh | G11B 5/3909 |
| | | | 257/E29.323 |
| 2013/0078482 A1* | 3/2013 | Shukh | H01F 10/14 |
| | | | 428/811.1 |
| 2013/0177781 A1* | 7/2013 | Chepulskyy | H01F 1/01 |
| | | | 428/812 |
| 2015/0129996 A1* | 5/2015 | Tang | G11C 11/161 |
| | | | 257/427 |
| 2019/0097124 A1 | 3/2019 | Lee et al. | |

* cited by examiner

US 11,672,183 B2

MAGNETIC MEMORY DEVICE HAVING A FERROMAGNETIC ELEMENT

CROSS-REFERENCE TO RELATED APPLICATION

This U.S. non-provisional patent application claims priority under 35 U.S.C. § 119 to Korean Patent Application No. 10-2019-0087335, filed on Jul. 19, 2019, in the Korean Intellectual Property Office, the disclosure of which is hereby incorporated by reference in its entirety.

BACKGROUND

Example embodiments of inventive concepts relate to a semiconductor device and, more particularly, to a magnetic memory device including a magnetic tunnel junction.

As high-speed and/or low power consumption electronic devices have been demanded, high-speed and/or low-voltage semiconductor memory devices used therein have also been demanded. Magnetic memory devices have been developed as semiconductor memory devices capable of partially or wholly satisfying these demands. The magnetic memory devices may emerge as next-generation semiconductor memory devices because of their high-speed and/or non-volatile characteristics.

Generally, a magnetic memory device may include a magnetic tunnel junction (MTJ). The magnetic tunnel junction may include two magnetic layers and an insulating layer disposed between the two magnetic layers. A resistance value of the magnetic tunnel junction may be changed depending on magnetization directions of the two magnetic layers. For example, when the magnetization directions of the two magnetic layers are anti-parallel to each other, the magnetic tunnel junction may have a relatively high resistance value. When the magnetization directions of the two magnetic layers are parallel to each other, the magnetic tunnel junction may have a relatively low resistance value. The magnetic memory device may write/read data using a difference between the resistance values of the magnetic tunnel junction. Highly integrated and/or low-power magnetic memory devices have been increasingly demanded with the development of an electronic industry. Thus, various researches are being conducted to satisfy these demands.

SUMMARY

Some example embodiments of inventive concepts may provide a magnetic memory device with excellent characteristics and a method of manufacturing the same.

Some example embodiments of inventive concepts may also provide a magnetic memory device which can be easily mass-produced, and a method of manufacturing the same.

According to some example embodiments, a magnetic memory device may include a reference magnetic structure including a first pinned pattern, a second pinned pattern including magnetic patterns and non-magnetic patterns, which are alternately stacked, and an exchange coupling pattern between the first pinned pattern and the second pinned pattern, a free magnetic structure, and a tunnel barrier pattern between the reference magnetic structure and the free magnetic structure. The second pinned pattern is between the first pinned pattern and the tunnel barrier pattern. The first pinned pattern is a ferromagnetic pattern consisting essentially of a ferromagnetic element.

According to some example embodiments, a magnetic memory device may include a reference magnetic structure including a first pinned pattern, a second pinned pattern including magnetic patterns and non-magnetic patterns, which are alternately stacked, and an exchange coupling pattern between the first pinned pattern and the second pinned pattern. The magnetic memory device includes a free magnetic structure, and a tunnel barrier pattern between the reference magnetic structure and the free magnetic structure. The second pinned pattern is between the first pinned pattern and the tunnel barrier pattern. The first pinned pattern is a single layer including a ferromagnetic element.

BRIEF DESCRIPTION OF THE DRAWINGS

Inventive concepts will become more apparent in view of the attached drawings and accompanying detailed description.

DETAILED DESCRIPTION OF EXAMPLE EMBODIMENTS

Hereinafter, embodiments of inventive concepts will be described in detail with reference to the accompanying drawings.

Figure 1:
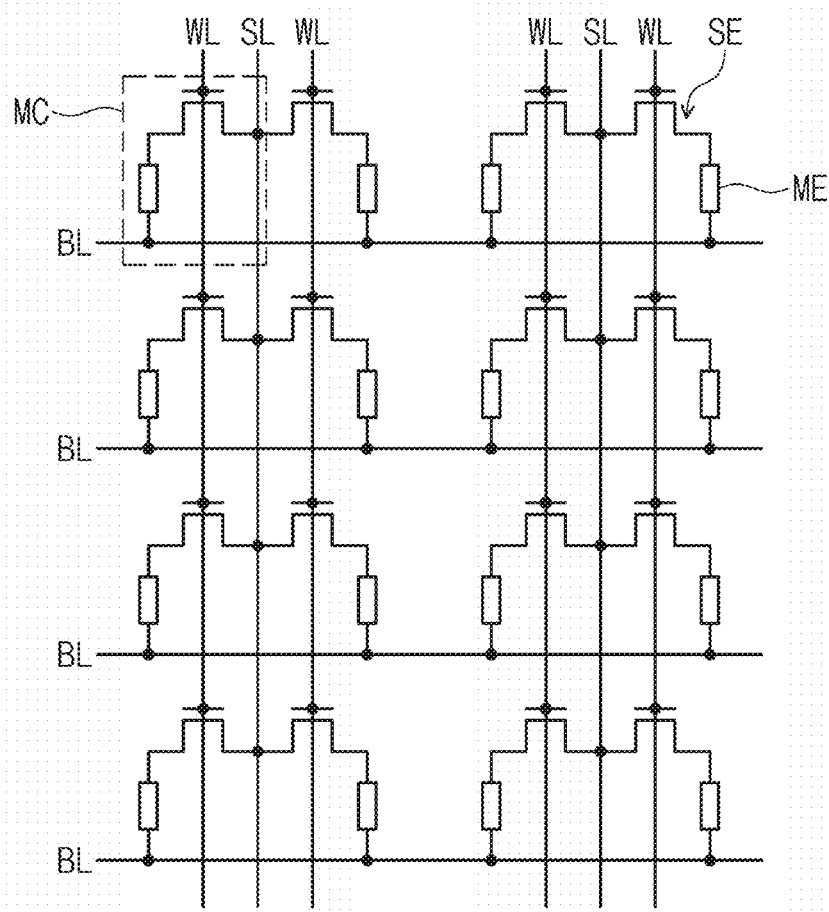
FIG. 1 is a circuit diagram illustrating a cell array of a magnetic memory device according to some example embodiments of inventive concepts.

FIG. 1 is a circuit diagram illustrating a cell array of a magnetic memory device according to some example embodiments of inventive concepts.

Referring to FIG. 1, a plurality of unit memory cells MC may be two-dimensionally and/or three-dimensionally arranged. Each of the unit memory cells MC may be electrically connected between a word line WL and a bit line BL which intersect each other. Each of the unit memory cells MC may include a memory element ME and a selection element SE. The selection element SE and the memory element ME may be electrically connected in series to each other.

The memory element ME may be connected between the bit line BL and the selection element SE. The selection element SE may be disposed between the memory element ME and a source line SL and may be controlled by the word line WL. The memory element ME may be or may include a variable resistance element of which a resistance state is switchable between two different resistance states by an electrical pulse applied thereto. In some example embodiments, the memory element ME may have a thin layer structure of which an electrical resistance is changeable using spin-transfer torque of electrons of a program current passing therethrough. The memory element ME may have a thin layer structure showing a magnetoresistance property and may include at least one ferromagnetic material and/or at least one anti-ferromagnetic material.

The selection element SE may selectively control the supply of a current to the memory element ME. For example, the selection element SE may be or include a diode, a PNP bipolar transistor, an NPN bipolar transistor, an NMOS field effect transistor, and/or a PMOS field effect transistor. When the selection element SE is or includes a three-terminal element (e.g., the bipolar transistor or the MOS field effect transistor), the source line SL may be connected to a source electrode of the transistor. In some example embodiments, the source line SL may be disposed between the word lines WL adjacent to each other, and two transistors may share one source line SL.

Figure 2:
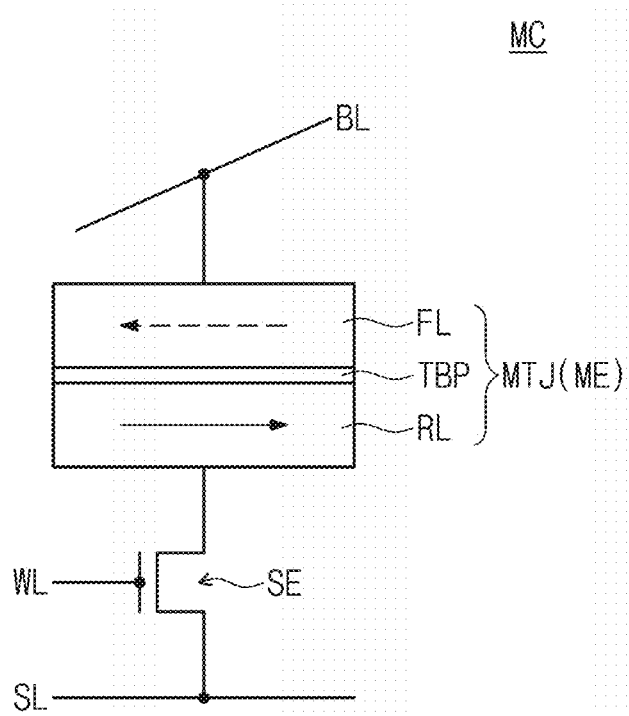
FIG. 2 is a circuit diagram illustrating a unit memory cell of a magnetic memory device according to some example embodiments of inventive concepts.

FIG. 2 is a circuit diagram illustrating a unit memory cell of a magnetic memory device according to some example embodiments of inventive concepts.

Referring to FIG. 2, the unit memory cell MC may include the memory element ME and the selection element SE. The memory element ME may include a magnetic tunnel junction MTJ which includes magnetic patterns FL and RL spaced apart from each other, and a tunnel barrier pattern TBP disposed between the magnetic patterns FL and RL. One of the magnetic patterns FL and RL may be a reference magnetic pattern RL having a magnetization direction which is fixed in one direction regardless of an external magnetic field and/or spin-transfer torque applied to the magnetic tunnel junction MTJ under a typical use environment. The other of the magnetic patterns FL and RL may be a free magnetic pattern FL of which a magnetization direction is changeable between two stable magnetization directions based on an external magnetic field or spin-transfer torque applied to the magnetic tunnel junction MTJ. An electrical resistance of the magnetic tunnel junction MTJ when the magnetization directions of the reference and free magnetic patterns RL and FL are anti-parallel to each other may be much greater than that of the magnetic tunnel junction MTJ when the magnetization directions of the reference and free magnetic patterns RL and FL are parallel to each other. For example, the electrical resistance of the magnetic tunnel junction MTJ may be adjusted by changing the magnetization direction of the free magnetic pattern FL. Logical data may be stored in the memory element ME of the unit memory cell MC by using an electrical resistance difference according to the magnetization directions of the reference and free magnetic patterns RL and FL.

Figure 3:
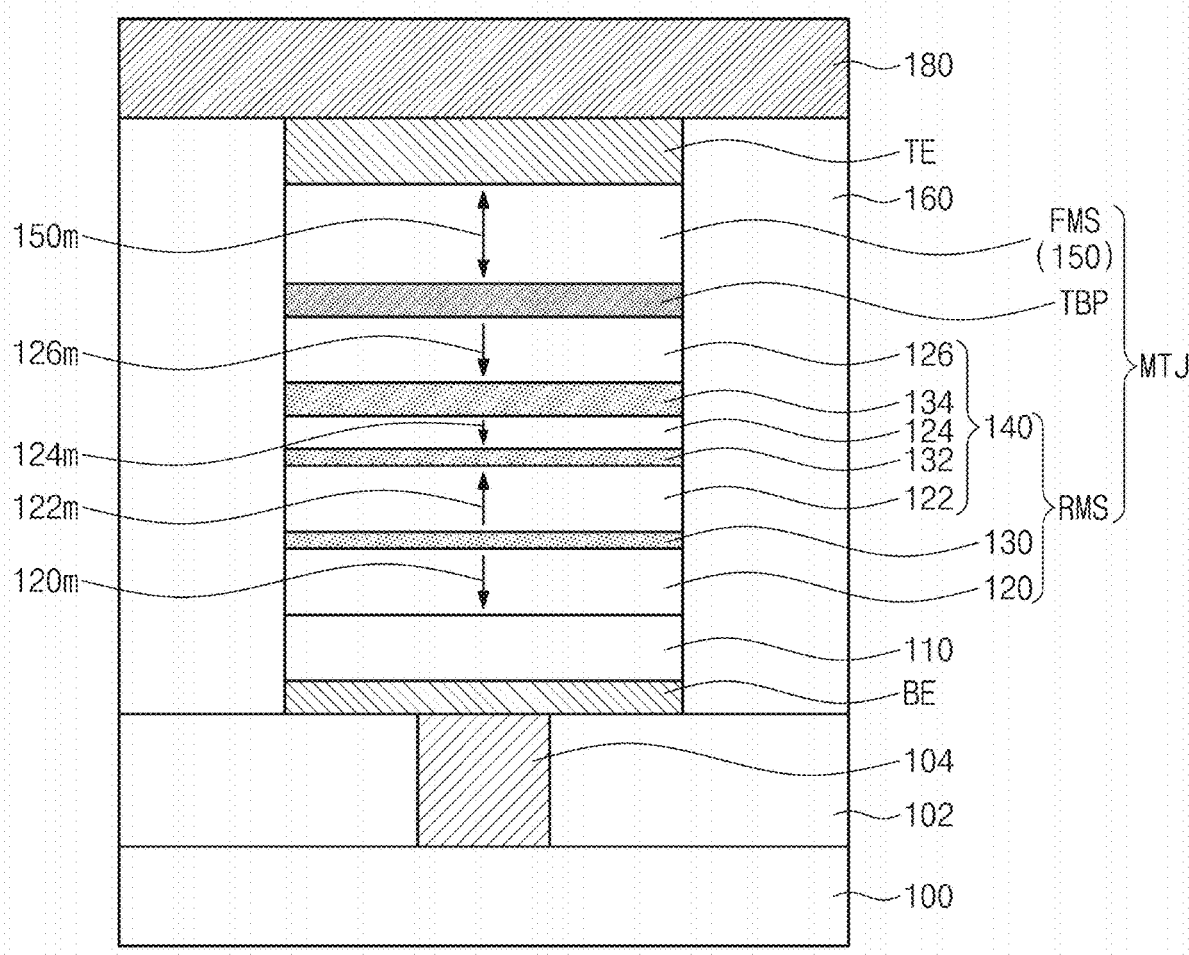
FIG. 3 is a cross-sectional view illustrating a magnetic memory device according to some example embodiments of inventive concepts.
Figure 4:
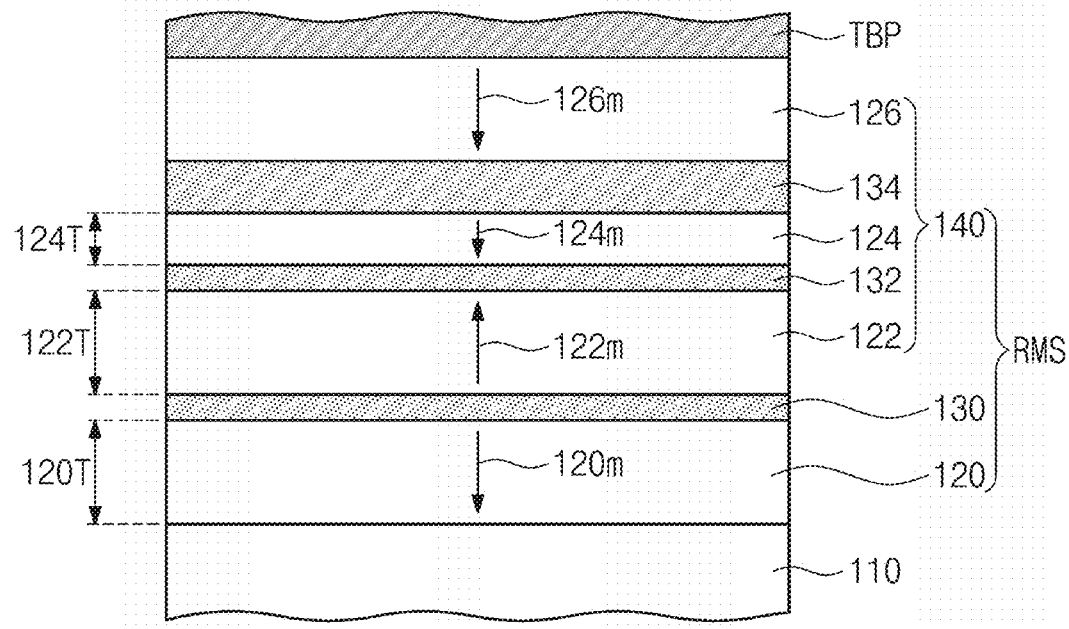
FIG. 4 is an enlarged view illustrating a reference magnetic structure of FIG. 3.

FIG. 3 is a cross-sectional view illustrating a magnetic memory device according to some example embodiments of inventive concepts. FIG. 4 is an enlarged view illustrating a reference magnetic structure of FIG. 3.

Referring to FIGS. 3 and 4, a lower interlayer insulating layer 102 may be disposed on a substrate 100. The substrate 100 may be or may include a semiconductor substrate that includes silicon, silicon on an insulator (SOI), silicon-germanium (SiGe), germanium (Ge), and/or gallium-arsenic (GaAs). The substrate 100 may be doped, e.g. may be lightly doped with boron; however, inventive concepts are not limited thereto. The substrate 100 may include an epitaxial layer, such as a homogenous or heterogeneous epitaxial layer deposited thereon; however, inventive concepts are not limited thereto. Selection elements may be provided on the substrate 100, and the lower interlayer insulating layer 102 may cover the selection elements. The selection elements may be or include field effect transistors and/or diodes. The lower interlayer insulating layer 102 may include at least one of an oxide, a nitride, or an oxynitride.

A lower contact plug 104 may be disposed in the lower interlayer insulating layer 102. The lower contact plug 104 may penetrate the lower interlayer insulating layer 102 so as to be electrically connected to one terminal of a corresponding one of the selection elements. The lower contact plug 104 may include at least one of a doped semiconductor material (e.g., doped silicon such as doped polysilicon), a metal (e.g., tungsten, titanium, and/or tantalum), a conductive metal nitride (e.g., titanium nitride, tantalum nitride, and/or tungsten nitride), or a metal-semiconductor compound (e.g., a metal silicide).

A bottom electrode BE may be disposed on the lower interlayer insulating layer 102. The bottom electrode BE may be electrically connected to the lower contact plug 104. The bottom electrode BE may include a conductive material. For example, the bottom electrode BE may include a conductive metal nitride such as titanium nitride and/or tantalum nitride.

A magnetic tunnel junction pattern MTJ may be disposed on the lower interlayer insulating layer 102 and may be electrically connected to the lower contact plug 104 through the bottom electrode BE. The bottom electrode BE may be disposed between the magnetic tunnel junction pattern MTJ and the lower contact plug 104. The magnetic tunnel junction pattern MTJ may include a reference magnetic structure RMS, a free magnetic structure FMS, and a tunnel barrier pattern TBP between the reference magnetic structure RMS and the free magnetic structure FMS. In some example embodiments, the reference magnetic structure RMS may be disposed between the bottom electrode BE and the tunnel barrier pattern TBP.

A top electrode TE may be disposed on the magnetic tunnel junction pattern MTJ. The magnetic tunnel junction pattern MTJ may be disposed between the bottom electrode BE and the top electrode TE. In some example embodiments, the free magnetic structure FMS may be disposed between the tunnel barrier pattern TBP and the top electrode TE. The top electrode TE may include a conductive material. For example, the top electrode TE may include at least one of a metal (e.g., tantalum (Ta), aluminum (Al), copper (Cu), gold (Au), silver (Ag), and/or titanium (Ti)) or a conductive metal nitride (e.g., tantalum nitride (TaN) and/or titanium nitride (TiN)).

A seed pattern 110 may be disposed between the magnetic tunnel junction pattern MTJ and the bottom electrode BE. The seed pattern 110 may include a material that assists crystal growth of magnetic layers constituting, or included in, the magnetic tunnel junction pattern MTJ. The seed pattern 110 may include at least one of chromium (Cr), iridium (Ir), or ruthenium (Ru). In some example embodiments, the seed pattern 110 may be disposed between the reference magnetic structure RMS and the bottom electrode BE.

The reference magnetic structure RMS may include a first pinned pattern 120, a second pinned pattern 140 between the first pinned pattern 120 and the tunnel barrier pattern TBP, and an exchange coupling pattern 130 between the first pinned pattern 120 and the second pinned pattern 140. The second pinned pattern 140 may include magnetic patterns 122, 124 and 126 and non-magnetic patterns 132 and 134, which are alternately stacked. In some example embodiments, the second pinned pattern 140 may include a first ferromagnetic pattern 122 between the exchange coupling pattern 130 and the tunnel barrier pattern TBP, a second ferromagnetic pattern 124 between the first ferromagnetic pattern 122 and the tunnel barrier pattern TBP, a polarization enhancement magnetic pattern 126 between the second ferromagnetic pattern 124 and the tunnel barrier pattern TBP, a first non-magnetic pattern 132 between the first ferromagnetic pattern 122 and the second ferromagnetic pattern 124, and a second non-magnetic pattern 134 between the second ferromagnetic pattern 124 and the polarization enhancement magnetic pattern 126.

The first pinned pattern 120 may be a ferromagnetic pattern consisting of (or formed of), or consisting essentially of, or including, a ferromagnetic element. The first pinned pattern 120 may include at least one of iron (Fe), cobalt (Co), or nickel (Ni). The first pinned pattern 120 may not include a non-magnetic element. The first pinned pattern 120 may be a single layer consisting of (or formed of), or consisting essentially of, or including, a ferromagnetic element. For example, the first pinned pattern 120 may be a single layer of cobalt (Co).

The first pinned pattern 120 may be disposed between the seed pattern 110 and the exchange coupling pattern 130. The seed pattern 110 may be in contact with, e.g. may have a portion that directly contacts, one surface of the first pinned pattern 120, and the exchange coupling pattern 130 may be in contact, e.g. may have a portion that directly contacts, with another surface of the first pinned pattern 120. The first pinned pattern 120 may have a perpendicular magnetization property by magnetic anisotropy induced by a junction of the seed pattern 110 and the first pinned pattern 120 and/or a junction of the exchange coupling pattern 130 and the first pinned pattern 120. A magnetization direction 120m of the first pinned pattern 120 may be substantially perpendicular to an interface between the tunnel barrier pattern TBP and the free magnetic structure FMS and may be fixed in one direction, e.g. may be fixed in a direction toward the substrate 100. The first pinned pattern 120 may have a thickness 120T in a direction perpendicular to the interface between the tunnel barrier pattern TBP and the free magnetic structure FMS (i.e., in a direction perpendicular to a surface, e.g. a surface of the substrate 100).

The seed pattern 110 may include a material that assists crystal growth of the first pinned pattern 120. For example, the seed pattern 110 may include at least one of chromium (Cr), iridium (Ir), or ruthenium (Ru). The exchange coupling pattern 130 may include a non-magnetic material having an anti-ferromagnetic coupling property. For example, the exchange coupling pattern 130 may include at least one of iridium (Ir) or ruthenium (Ru). The exchange coupling pattern 130 may include the same and/or different materials from the seed pattern 110.

The first ferromagnetic pattern 122 may include the same ferromagnetic material as the first pinned pattern 120. The first ferromagnetic pattern 122 may include at least one of iron (Fe), cobalt (Co), or nickel (Ni) and may not include a non-magnetic element. The first ferromagnetic pattern 122 may be a single layer consisting of (or formed of), or consisting essentially of, or including, a ferromagnetic element. For example, the first ferromagnetic pattern 122 may be a single layer of cobalt (Co).

The first ferromagnetic pattern 122 may be disposed between the exchange coupling pattern 130 and the first non-magnetic pattern 132. The exchange coupling pattern 130 may be in contact with, e.g. may have a portion that directly contacts, one surface of the first ferromagnetic pattern 122, and the first non-magnetic pattern 132 may be in contact with, e.g. may have a portion that directly contacts, another surface of the first ferromagnetic pattern 122. The first ferromagnetic pattern 122 may have a perpendicular magnetization property by magnetic anisotropy induced by a junction of the exchange coupling pattern 130 and the first ferromagnetic pattern 122 and/or a junction of the first non-magnetic pattern 132 and the first ferromagnetic pattern 122. A magnetization direction 122m of the first ferromagnetic pattern 122 may be substantially perpendicular to the interface between the tunnel barrier pattern TBP and the free magnetic structure FMS.

The first ferromagnetic pattern 122 may be anti-ferromagnetically coupled to the first pinned pattern 120 by the exchange coupling pattern 130. The exchange coupling pattern 130 may couple the magnetization direction 120m of the first pinned pattern 120 to the magnetization direction 122m of the first ferromagnetic pattern 122 in such a way that the magnetization directions 120m and 122m are anti-parallel to each other. For example, the magnetization direction 122m of the first ferromagnetic pattern 122 may be fixed in a direction anti-parallel to the magnetization direction 120m of the first pinned pattern 120.

The first ferromagnetic pattern 122 may have a thickness 122T in the direction perpendicular to the interface between the tunnel barrier pattern TBP and the free magnetic structure FMS (e.g., in a direction perpendicular to a surface). The thickness 120T of the first pinned pattern 120 may be equal to or greater than the thickness 122T of the first ferromagnetic pattern 122.

The first non-magnetic pattern 132 may include a non-magnetic material having an anti-ferromagnetic coupling property. For example, the first non-magnetic pattern 132 may include at least one of iridium (Ir) or ruthenium (Ru).

The second ferromagnetic pattern 124 may include the same ferromagnetic material as the first ferromagnetic pattern 122. In some example embodiments, the first and second ferromagnetic patterns 122 and 124 may include the same ferromagnetic material as the first pinned pattern 120. The second ferromagnetic pattern 124 may include at least one of iron (Fe), cobalt (Co), or nickel (Ni) and may not include a non-magnetic element. The second ferromagnetic pattern 124 may be a single layer consisting of (or formed of), or consisting essentially of, or including, a ferromagnetic element. For example, the second ferromagnetic pattern 124 may be a single layer of cobalt (Co).

The second ferromagnetic pattern 124 may be disposed between the first non-magnetic pattern 132 and the second non-magnetic pattern 134. The first non-magnetic pattern 132 may be in contact with, e.g. may have a portion that directly contacts, one surface of the second ferromagnetic pattern 124, and the second non-magnetic pattern 134 may be in contact with, e.g. may have a portion that directly contacts, another surface of the second ferromagnetic pattern 124. The second ferromagnetic pattern 124 may have a perpendicular magnetization property by magnetic anisotropy induced by a junction of the first non-magnetic pattern 132 and the second ferromagnetic pattern 124. A magnetization direction 124m of the second ferromagnetic pattern 124 may be substantially perpendicular to the interface between the tunnel barrier pattern TBP and the free magnetic structure FMS.

The second ferromagnetic pattern 124 may be anti-ferromagnetically coupled to the first ferromagnetic pattern 122 by the first non-magnetic pattern 132. The first non-magnetic pattern 132 may couple the magnetization direction 122m of the first ferromagnetic pattern 122 to the magnetization direction 124*m* of the second ferromagnetic pattern 124 in such a way that the magnetization directions 122*m* and 124*m* are anti-parallel to each other. In other words, the magnetization direction 124*m* of the second ferromagnetic pattern 124 may be fixed in anti-parallel to the magnetization direction 122*m* of the first ferromagnetic pattern 122.

The second ferromagnetic pattern 124 may have a thickness 124T in the direction perpendicular to the interface between the tunnel barrier pattern TBP and the free magnetic structure FMS (i.e., in a direction perpendicular to a surface). The thickness 120T of the first pinned pattern 120 may be greater than the thickness 124T of the second ferromagnetic pattern 124. In some example embodiments, the thickness 120T of the first pinned pattern 120 may be equal to or greater than the thickness 122T of the first ferromagnetic pattern 122, and the thickness 122T of the first ferromagnetic pattern 122 may be greater than the thickness 124T of the second ferromagnetic pattern 124.

The second non-magnetic pattern 134 may include a non-magnetic material having a ferromagnetic coupling property. For example, the second non-magnetic pattern 134 may include at least one of tungsten (W), molybdenum (Mo), niobium (Nb), tantalum (Ta), or vanadium (V).

The polarization enhancement magnetic pattern 126 may include a magnetic material capable of inducing interfacial perpendicular magnetic anisotropy at an interface of the tunnel barrier pattern TBP and the polarization enhancement magnetic pattern 126. For example, the polarization enhancement magnetic pattern 126 may include a magnetic material having a body-centered cubic (BCC) structure, and may further include a non-magnetic element. For example, the polarization enhancement magnetic pattern 126 may include at least one of cobalt (Co), iron (Fe), or nickel (Ni) and may further include at least one of boron (B), zinc (Zn), aluminum (Al), titanium (Ti), ruthenium (Ru), tantalum (Ta), silicon (Si), silver (Ag), gold (Au), copper (Cu), carbon (C), or nitrogen (N). For example, the polarization enhancement magnetic pattern 126 may include cobalt-iron (CoFe) and/or nickel-iron (NiFe) and may further include boron (B). For example, the polarization enhancement magnetic pattern 126 may include cobalt-iron-boron (CoFeB).

The polarization enhancement magnetic pattern 126 may be disposed between the second non-magnetic pattern 134 and the tunnel barrier pattern TBP. The second non-magnetic pattern 134 may be in contact with, e.g. may have a portion that directly contacts, one surface of the polarization enhancement magnetic pattern 126, and the tunnel barrier pattern TBP may be in contact with, e.g. may have a portion that directly contacts, another surface of the polarization enhancement magnetic pattern 126. The polarization enhancement magnetic pattern 126 may have a perpendicular magnetization property by magnetic anisotropy induced by a junction of the tunnel barrier pattern TBP and the polarization enhancement magnetic pattern 126. A magnetization direction 126*m* of the polarization enhancement magnetic pattern 126 may be substantially perpendicular to the interface between the tunnel barrier pattern TBP and the free magnetic structure FMS.

The polarization enhancement magnetic pattern 126 may be ferromagnetically coupled to the second ferromagnetic pattern 124 by the second non-magnetic pattern 134. The second non-magnetic pattern 134 may couple the magnetization direction 126*m* of the polarization enhancement magnetic pattern 126 to the magnetization direction 124*m* of the second ferromagnetic pattern 124 in such a way that the magnetization directions 126*m* and 124*m* are parallel to each other. For example, the magnetization direction 126*m* of the polarization enhancement magnetic pattern 126 may be fixed in parallel to the magnetization direction 124*m* of the second ferromagnetic pattern 124.

The tunnel barrier pattern TBP may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN). For example, the tunnel barrier pattern TBP may include magnesium oxide (MgO) having a sodium chloride (NaCl) crystal structure.

The free magnetic structure FMS may include at least one free magnetic pattern 150. The free magnetic pattern 150 may be in contact with, e.g. may have a portion that directly contacts, the tunnel barrier pattern TBP. The free magnetic pattern 150 may have a perpendicular magnetization property by magnetic anisotropy induced by a junction of the free magnetic pattern 150 and the tunnel barrier pattern TBP. A magnetization direction 150*m* of the free magnetic pattern 150 may be changed to be parallel or anti-parallel to the magnetization direction 126*m* of the polarization enhancement magnetic pattern 126. When the magnetization direction 126*m* of the polarization enhancement magnetic pattern 126 is parallel to the magnetization direction 150*m* of the free magnetic pattern 150, the magnetic tunnel junction pattern MTJ may have a low resistance value. On the contrary, when the magnetization direction 126*m* of the polarization enhancement magnetic pattern 126 is anti-parallel to the magnetization direction 150*m* of the free magnetic pattern 150, the magnetic tunnel junction pattern MTJ may have a high resistance value. The free magnetic pattern 150 may include a magnetic material capable of inducing the magnetic anisotropy at an interface of the free magnetic pattern 150 and the tunnel barrier pattern TBP. For example, the free magnetic pattern 150 may include cobalt-iron-boron (CoFeB).

An upper interlayer insulating layer 160 may be disposed on the lower interlayer insulating layer 102 to cover the bottom electrode BE, the seed pattern 110, the magnetic tunnel junction pattern MTJ, and the top electrode TE. The upper interlayer insulating layer 160 may include at least one of an oxide, a nitride, or an oxynitride. An interconnection line 180 may be disposed on the upper interlayer insulating layer 160. The interconnection line 180 may be electrically connected to the magnetic tunnel junction pattern MTJ through the top electrode TE. The interconnection line 180 may include at least one of a metal (e.g., titanium, tantalum, copper, aluminum, or tungsten) or a conductive metal nitride (e.g., titanium nitride or tantalum nitride). In some example embodiments, the interconnection line 180 may function as a bit line.

If the first pinned pattern 120 is formed of an alloy layer of a non-magnetic element and a ferromagnetic element or a multi-layered thin layer including non-magnetic layers and ferromagnetic layers, the non-magnetic element in the first pinned pattern 120 may be diffused by a subsequent thermal treatment process, and thus a perpendicular magnetization property of the first pinned pattern 120 may be deteriorated. Alternatively or additionally, if the first pinned pattern 120 is formed of the alloy layer or the multi-layered thin layer, a surface roughness of the first pinned pattern 120 may be increased. Thus, magnetic properties (e.g., an exchange magnetic field (Hex) and/or a switching property) of the magnetic tunnel junction pattern MTJ may be deteriorated.

However, according to some example embodiments of inventive concepts, the first pinned pattern 120 may be a ferromagnetic pattern consisting of (or formed of), or consisting essentially of, or including, a ferromagnetic element and may not include a non-magnetic element. Since the first pinned pattern 120 does not include the non-magnetic element, the influence of a subsequent thermal treatment process on the perpendicular magnetization property of the first pinned pattern 120 may be minimized or reduced. For example, the first pinned pattern 120 may have a stable perpendicular magnetization property. Alternatively or additionally, since the first pinned pattern 120 is formed of the single layer of the ferromagnetic element, a surface roughness of the first pinned pattern 120 may be reduced. Thus, magnetic properties (e.g., an exchange magnetic field (Hex) and/or a switching property) of the magnetic tunnel junction pattern MTJ may be improved.

Furthermore, in the second pinned pattern 140, the polarization enhancement magnetic pattern 126 may be ferromagnetically coupled to the second ferromagnetic pattern 124 and the first and second ferromagnetic patterns 122 and 124 may be anti-ferromagnetically coupled to each other. Perpendicular magnetic anisotropy of the polarization enhancement magnetic pattern 126 may be improved by the ferromagnetic coupling of the polarization enhancement magnetic pattern 126 and the second ferromagnetic pattern 124, and thus a tunneling magnetoresistance ratio (TMR) of the magnetic tunnel junction pattern MTJ may be improved. A net magnetic moment of the second pinned pattern 140 may be reduced by the anti-ferromagnetic coupling of the first and second ferromagnetic patterns 122 and 124, and thus a magnetic stay field of the second pinned pattern 140 may be reduced. As a result, it may be possible to reduce a phenomenon in which a distribution of a switching field (Hc) of the free magnetic structure FMS is shifted, and thus a switching property of the magnetic tunnel junction pattern MTJ may be improved.

Figure 5:
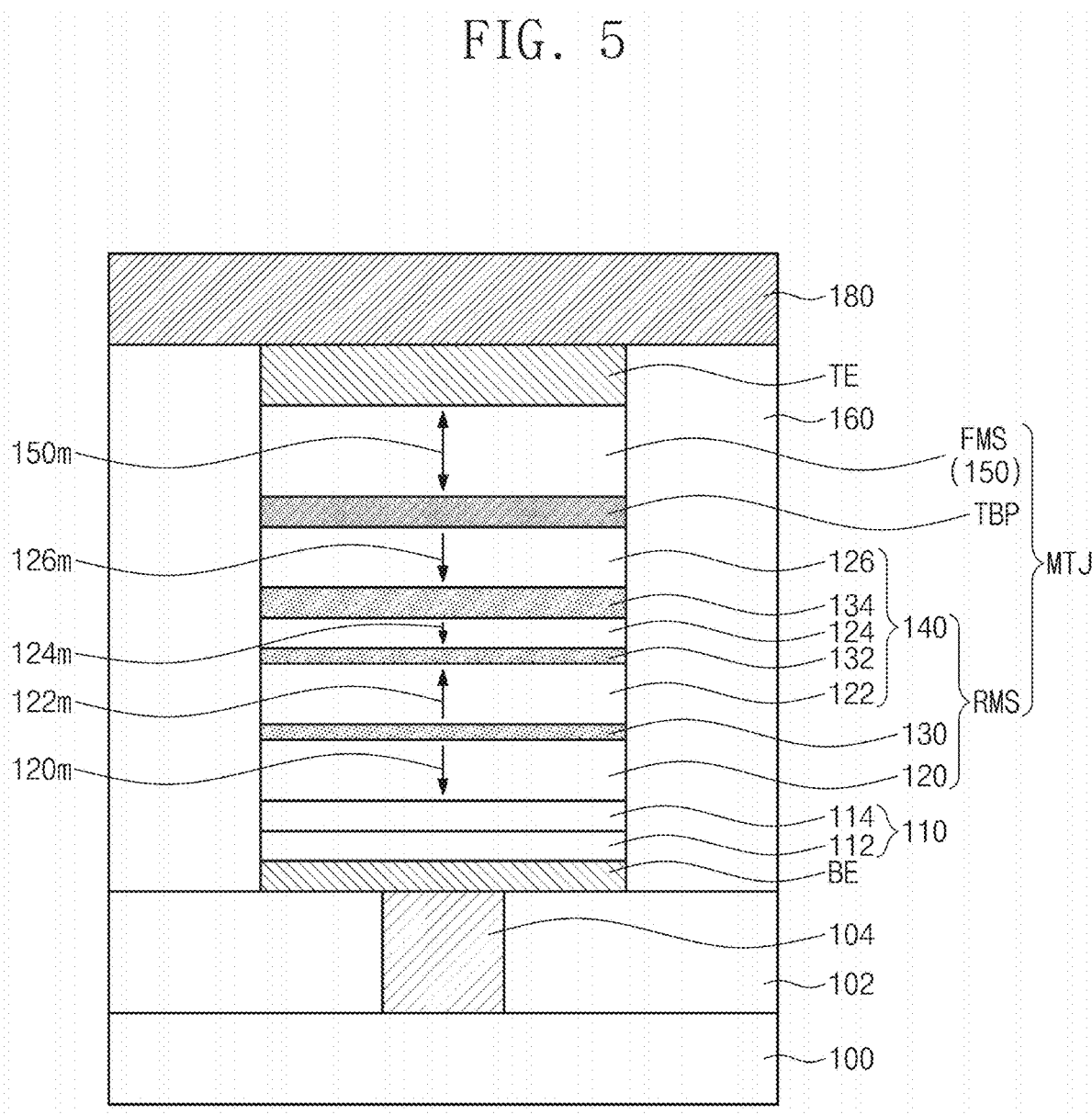
FIG. 5 is a cross-sectional view illustrating a magnetic memory device according to some example embodiments of inventive concepts.

FIG. 5 is a cross-sectional view illustrating a magnetic memory device according to some example embodiments of inventive concepts. Hereinafter, differences between example embodiments described with reference to FIG. 5 and example embodiments described with reference to FIGS. 3 and 4 will be mainly described for the purpose of ease and convenience in explanation.

Referring to FIG. 5, the seed pattern 110 may be disposed between the magnetic tunnel junction pattern MTJ and the bottom electrode BE. In some example embodiments, the seed pattern 110 may include a first sub-pattern 112 adjacent to the bottom electrode BE, and a second sub-pattern 114 disposed between the first sub-pattern 112 and the magnetic tunnel junction pattern MTJ. The first sub-pattern 112 may inhibit a crystal structure of the bottom electrode BE from being projected to the magnetic tunnel junction pattern MTJ. Thus, it may be possible to minimize or reduce the influence of the crystal structure of the bottom electrode BE on crystal growth of the magnetic tunnel junction pattern MTJ. At least a portion of the first sub-pattern 112 may be amorphous. For example, the first sub-pattern 112 may include at least one of tantalum (Ta), nickel (Ni), or chromium (Cr). The first sub-pattern 112 may further include a non-metal element (e.g., boron (B) and/or carbon (C)). The second sub-pattern 114 may include a material that assists crystal growth of magnetic layers constituting, or included in, the magnetic tunnel junction pattern MTJ. For example, the second sub-pattern 114 may include at least one of chromium (Cr), iridium (Ir), or ruthenium (Ru).

The first pinned pattern 120 may be disposed between the seed pattern 110 and the exchange coupling pattern 130. The second sub-pattern 114 may be in contact with, e.g. may have a portion that directly contacts, one surface of the first pinned pattern 120, and the exchange coupling pattern 130 may be in contact with, e.g. may have a portion that directly contacts, another surface of the first pinned pattern 120. The first pinned pattern 120 may have a perpendicular magnetization property by magnetic anisotropy induced by a junction of the second sub-pattern 114 and the first pinned pattern 120 and/or a junction of the exchange coupling pattern 130 and the first pinned pattern 120. The second sub-pattern 114 may include a material that assists crystal growth of the first pinned pattern 120. The second sub-pattern 114 may include at least one of, for example, chromium (Cr), iridium (Ir), or ruthenium (Ru). Except for the differences described above, other components and features of the magnetic memory device according to example embodiments may be substantially the same as corresponding components and features of the magnetic memory device described with reference to FIGS. 3 and 4.

Figure 6:
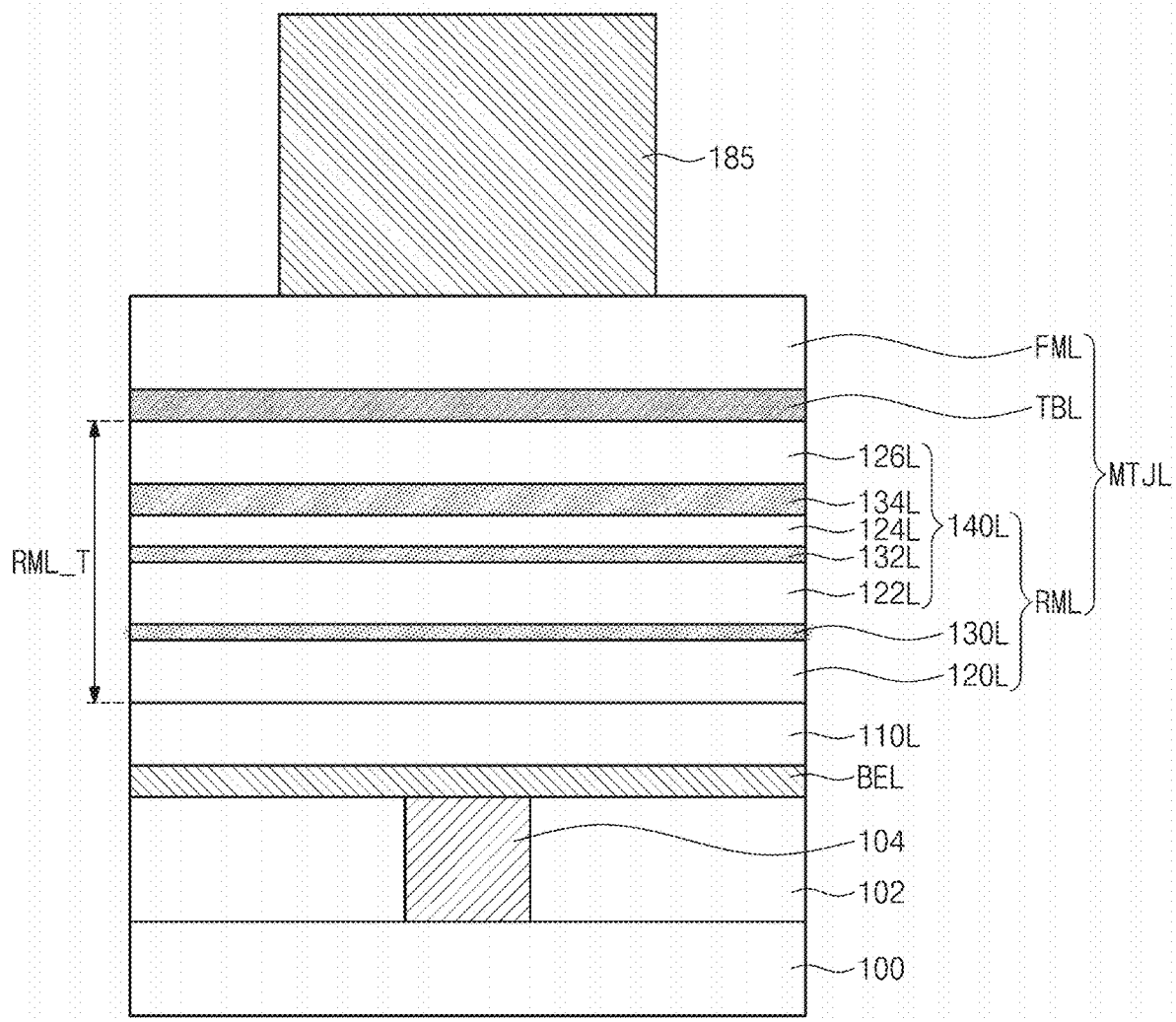
FIGS. 6 and 7 are cross-sectional views illustrating a method of manufacturing a magnetic memory device, according to some example embodiments of inventive concepts.
Figure 7:
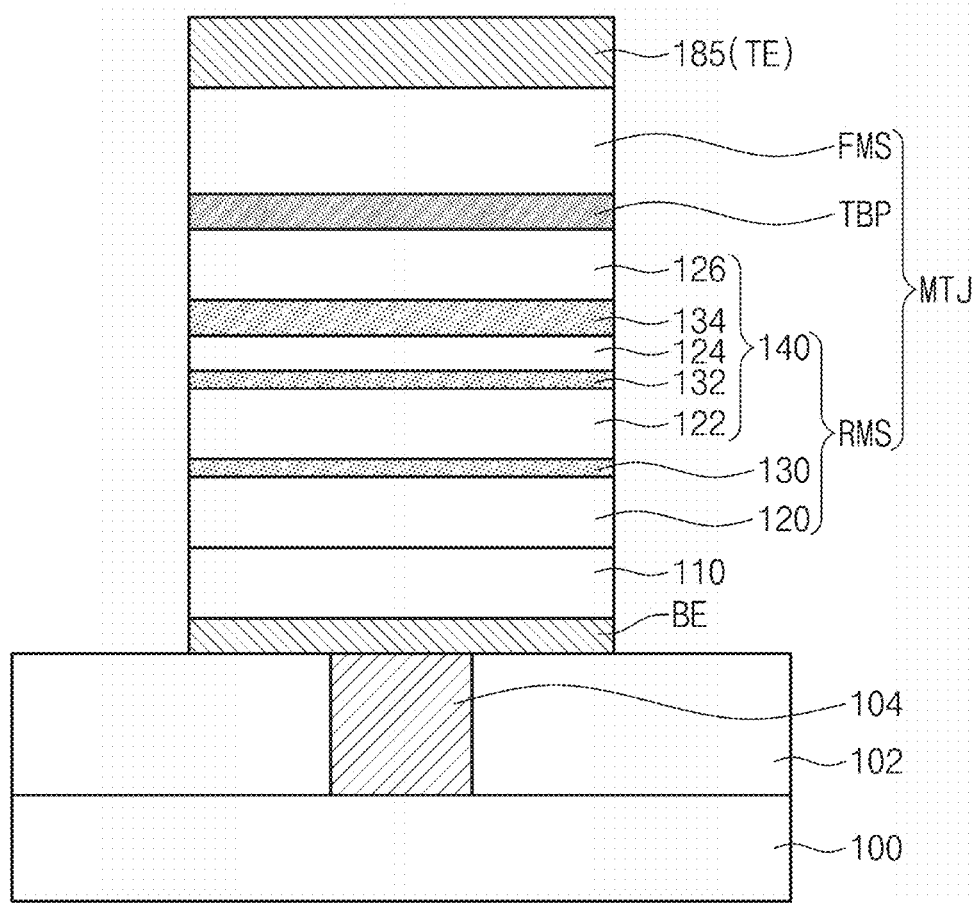

FIGS. 6 and 7 are cross-sectional views illustrating a method of manufacturing a magnetic memory device, according to some example embodiments of inventive concepts. Hereinafter, the descriptions to the same components and/or features as in example embodiments of FIGS. 3 and 4 will be omitted or mentioned briefly for the purpose of ease and convenience in explanation.

Referring to FIG. 6, a lower interlayer insulating layer 102 may be formed on a substrate 100. The substrate 100 may include a semiconductor substrate. For example, the substrate 100 may include a silicon substrate, a germanium substrate, and/or a silicon-germanium substrate. Selection elements (not shown) may be formed on the substrate 100, and the lower interlayer insulating layer 102 may be formed to cover the selection elements. The selection elements may be field effect transistors or diodes. A lower contact plug 104 may be formed in the lower interlayer insulating layer 102. The lower contact plug 104 may penetrate the lower interlayer insulating layer 102 so as to be electrically connected to one terminal of a corresponding one of the selection elements. In some example embodiments, the formation of the lower contact plug 104 may include forming a lower contact hole in the lower interlayer insulating layer 102, and forming a lower contact layer filling the lower contact hole.

A bottom electrode layer BEL may be formed on the lower interlayer insulating layer 102. The bottom electrode layer BEL may include a conductive metal nitride such as titanium nitride and/or tantalum nitride. A seed layer 110L may be formed on the bottom electrode layer BEL. The seed layer 110L may include a material (e.g., iridium (Ir) or ruthenium (Ru)) capable of assisting crystal growth of magnetic layers to be formed thereon. In some example embodiments, the seed layer 110L may include a first sub-layer and a second sub-layer, which are stacked on the bottom electrode layer BEL. In this case, the first sub-layer may be disposed between the bottom electrode layer BEL and the second sub-layer. At least a portion of the first sub-layer may be amorphous, and the second sub-layer may include a material (e.g., iridium (Ir) or ruthenium (Ru)) capable of assisting crystal growth of magnetic layers to be formed thereon. Each of the bottom electrode layer BEL and the seed layer 110L may be formed by a sputtering deposition process, a chemical vapor deposition (CVD) process, and/or an atomic layer deposition (ALD) process.

A first pinned layer 120L may be formed on the seed layer 110L. The first pinned layer 120L may be a single-layered ferromagnetic layer consisting of (or formed of), or consisting essentially of, or including, a ferromagnetic element. The first pinned layer 120L may not include a non-magnetic element. For example, the first pinned layer 120L may be a single layer of cobalt (Co). The first pinned layer 120L may be formed by a sputtering deposition process, a CVD process, and/or an ALD process. According to some example embodiments of inventive concepts, since the first pinned layer 120L does not include the non-magnetic element, the deposition process for forming the first pinned layer 120L may be performed at room temperature.

An exchange coupling layer 130L may be formed on the first pinned layer 120L. The exchange coupling layer 130L may include a non-magnetic material having an anti-ferromagnetic coupling property and may be formed by a sputtering deposition process, a CVD process, and/or an ALD process.

A second pinned layer 140L may be formed on the exchange coupling layer 130L. The second pinned layer 140L may include a first ferromagnetic layer 122L, a first non-magnetic layer 132L, a second ferromagnetic layer 124, a second non-magnetic layer 134L, and a polarization enhancement magnetic layer 126L, which are sequentially stacked on the exchange coupling layer 130L. In some example embodiments, the first and second ferromagnetic layers 122L and 124L may include the same ferromagnetic material as the first pinned layer 120L. The first and second ferromagnetic layers 122L and 124L may not include a non-magnetic element. Each of the first and second ferromagnetic layers 122L and 124L may be a single layer consisting of (or formed of), or consisting essentially of, or including, a ferromagnetic element. For example, each of the first and second ferromagnetic layers 122L and 124L may be a single layer of cobalt (Co). The first non-magnetic layer 132L may include a non-magnetic material having an anti-ferromagnetic coupling property, and the second non-magnetic layer 134L may include a non-magnetic material having a ferromagnetic coupling property. The polarization enhancement magnetic layer 126L may include a magnetic material capable of inducing interfacial perpendicular magnetic anisotropy. The second pinned layer 140L may be formed by a sputtering deposition process, a CVD process, and/or an ALD process. According to some example embodiments of inventive concepts, since the first and second ferromagnetic layers 122L and 124L do not include the non-magnetic element, the deposition process for forming the second pinned layer 140L may be performed at room temperature.

The first pinned layer 120L, the exchange coupling layer 130L and the second pinned layer 140L may constitute, or be included in, a reference magnetic layer RML. According to some example embodiments of inventive concepts, since the first pinned layer 120L and the first and second ferromagnetic layers 122L and 124L do not include the non-magnetic element, the deposition processes for forming the reference magnetic layer RML may be performed at room temperature. In addition, since the first pinned layer 120L is formed of the single layer of the ferromagnetic element, a thickness RML_T of the reference magnetic layer RML may be reduced.

A tunnel barrier layer TBL may be formed on the reference magnetic layer RML. The tunnel barrier layer TBL may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer and may be formed using, for example, a sputtering deposition process.

A free magnetic layer FML may be formed on the tunnel barrier layer TBL. The free magnetic layer FML may be deposited in an amorphous state and may include, for example, cobalt-iron-boron (CoFeB). The free magnetic layer FML may be formed by a sputtering deposition process, a CVD process, and/or an ALD process. The free magnetic layer FML may be crystallized using the tunnel barrier layer TBL as a seed by a subsequent thermal treatment process.

The reference magnetic layer RML, the tunnel barrier layer TBL and the free magnetic layer FML may constitute, or be included in, a magnetic tunnel junction layer MTJL. A conductive mask pattern 185 may be formed on the magnetic tunnel junction layer MTJL. For example, the conductive mask pattern 185 may include at least one of tungsten, titanium, tantalum, aluminum, or a metal nitride (e.g., titanium nitride or tantalum nitride). The conductive mask pattern 185 may define a region in which a magnetic tunnel junction pattern will be formed.

Referring to FIG. 7, an etching process for etching the magnetic tunnel junction layer MTJL may be performed using the conductive mask pattern 185 as an etch mask. The etching process may be, for example, an ion beam etching process. The magnetic tunnel junction layer MTJL, the seed layer 110L and the bottom electrode layer BEL may be sequentially etched by the etching process. The etching of the magnetic tunnel junction layer MTJL may include sequentially etching the free magnetic layer FML, the tunnel barrier layer TBL, and the reference magnetic layer RML. According to the embodiments of inventive concepts, since the first pinned layer 120L is the single layer formed of the ferromagnetic element, the thickness RML_T of the reference magnetic layer RML may be reduced. Thus, a process margin of the etching process may be increased.

A magnetic tunnel junction pattern MTJ, a seed pattern 110 and a bottom electrode BE may be sequentially formed by the etching process. The magnetic tunnel junction pattern MTJ may include a reference magnetic structure RMS, a tunnel barrier pattern TBP, and a free magnetic structure FMS, which are sequentially stacked on the seed pattern 110. The reference magnetic structure RMS may include a first pinned pattern 120, a second pinned pattern 140 between the first pinned pattern 120 and the tunnel barrier pattern TBP, and an exchange coupling pattern 130 between the first pinned pattern 120 and the second pinned pattern 140. The second pinned pattern 140 may include a first ferromagnetic pattern 122 between the exchange coupling pattern 130 and the tunnel barrier pattern TBP, a second ferromagnetic pattern 124 between the first ferromagnetic pattern 122 and the tunnel barrier pattern TBP, a polarization enhancement magnetic pattern 126 between the second ferromagnetic pattern 124 and the tunnel barrier pattern TBP, a first non-magnetic pattern 132 between the first ferromagnetic pattern 122 and the second ferromagnetic pattern 124, and a second non-magnetic pattern 134 between the second ferromagnetic pattern 124 and the polarization enhancement magnetic pattern 126.

A portion of the conductive mask pattern 185 may remain on the magnetic tunnel junction pattern MTJ after the etching process, and the remaining portion of the conductive mask pattern 185 may function as a top electrode TE.

According to the embodiments of inventive concepts, since the first pinned layer 120L and the first and second ferromagnetic layers 122L and 124L do not include the non-magnetic element, the deposition processes for forming the reference magnetic layer RML may be performed at room temperature. In addition, since the first pinned layer 120L is the single layer consisting of (or formed of), or consisting essentially of, or including the ferromagnetic element, the thickness RML_T of the reference magnetic layer RML may be reduced. Thus, the process margin of the etching process for forming the magnetic tunnel junction pattern MTJ may be increased. Thus, mass production of the magnetic memory device may be easy.

Referring again to FIG. 3, an upper interlayer insulating layer 160 may be formed on the lower interlayer insulating layer 102 to cover the bottom electrode BE, the seed pattern 110, the magnetic tunnel junction pattern MTJ, and the top electrode TE. An interconnection line 180 may be formed on the upper interlayer insulating layer 160. The interconnection line 180 may be electrically connected to the magnetic tunnel junction pattern MTJ through the top electrode TE.

Figure 8:
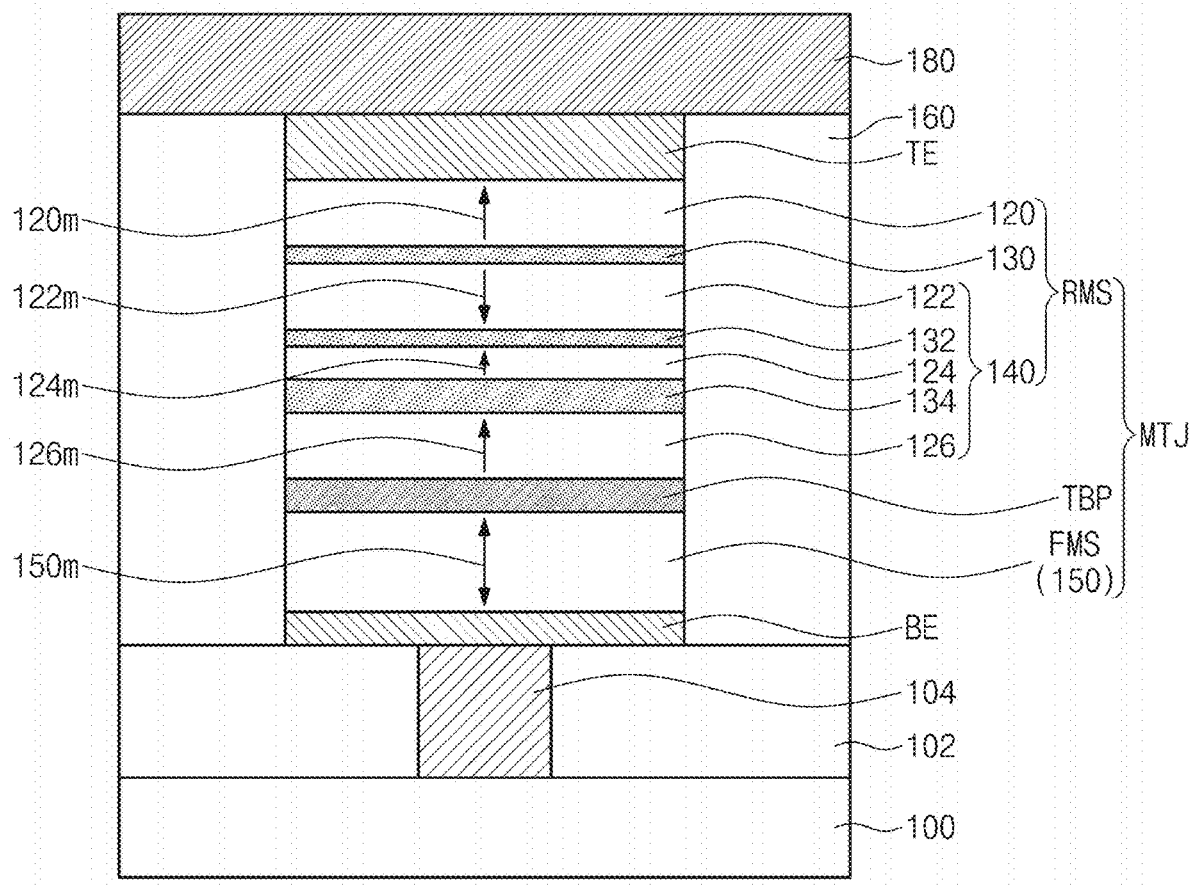
FIG. 8 is a cross-sectional view illustrating a magnetic memory device according to some example embodiments of inventive concepts.
Figure 9:
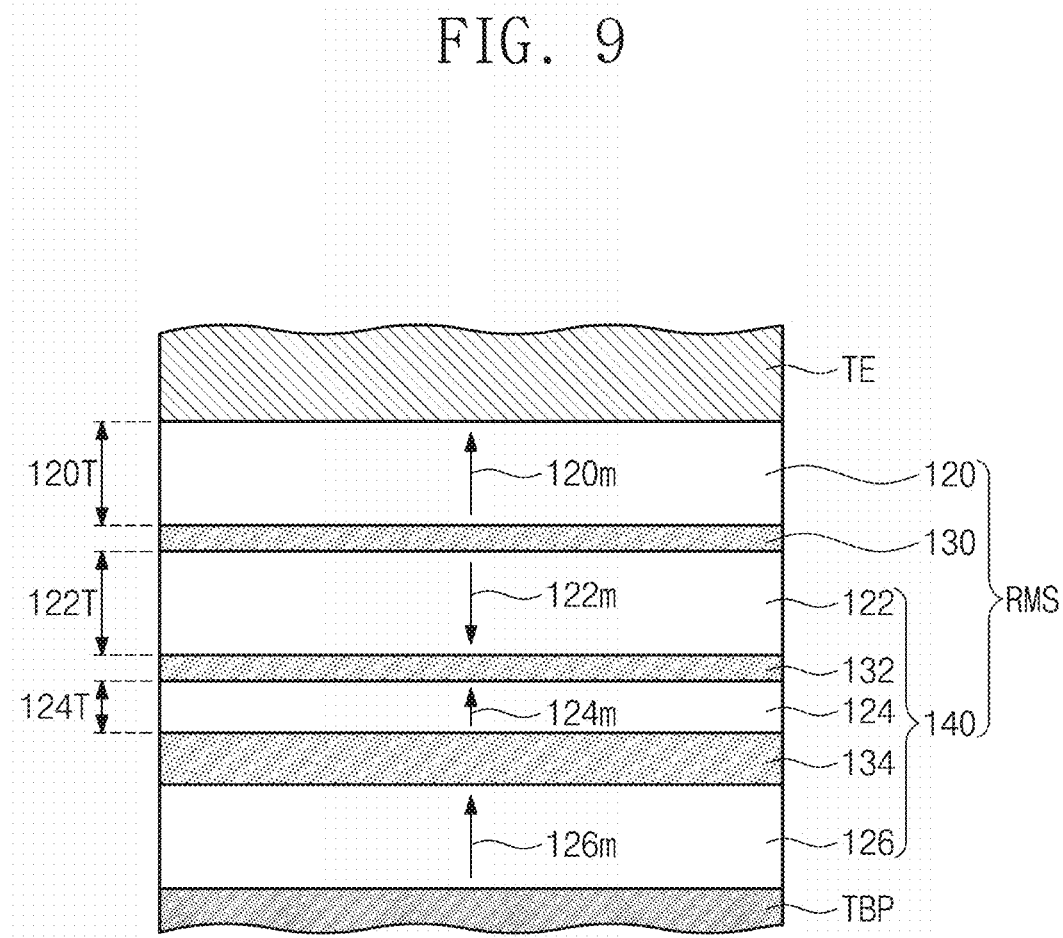
FIG. 9 is an enlarged view illustrating a reference magnetic structure of FIG. 8.

FIG. 8 is a cross-sectional view illustrating a magnetic memory device according to some example embodiments of inventive concepts. FIG. 9 is an enlarged view illustrating a reference magnetic structure of FIG. 8. Hereinafter, differences between the present embodiments and the above embodiments described with reference to FIGS. 3 and 4 will be mainly described for the purpose of ease and convenience in explanation.

Referring to FIGS. 8 and 9, the magnetic tunnel junction pattern MTJ may include the reference magnetic structure RMS, the free magnetic structure FMS, and the tunnel barrier pattern TBP therebetween. In some example embodiments, the free magnetic structure FMS may be disposed between the bottom electrode BE and the tunnel barrier pattern TBP, and the reference magnetic structure RMS may be disposed between the top electrode TE and the tunnel barrier pattern TBP.

The reference magnetic structure RMS may include the first pinned pattern 120, the second pinned pattern 140 between the first pinned pattern 120 and the tunnel barrier pattern TBP, and the exchange coupling pattern 130 between the first pinned pattern 120 and the second pinned pattern 140. The second pinned pattern 140 may include the first ferromagnetic pattern 122 between the exchange coupling pattern 130 and the tunnel barrier pattern TBP, the second ferromagnetic pattern 124 between the first ferromagnetic pattern 122 and the tunnel barrier pattern TBP, the polarization enhancement magnetic pattern 126 between the second ferromagnetic pattern 124 and the tunnel barrier pattern TBP, the first non-magnetic pattern 132 between the first ferromagnetic pattern 122 and the second ferromagnetic pattern 124, and the second non-magnetic pattern 134 between the second ferromagnetic pattern 124 and the polarization enhancement magnetic pattern 126.

In some example embodiments, the first pinned pattern 120 may be disposed between the top electrode TE and the exchange coupling pattern 130. The exchange coupling pattern 130 may be in contact with, e.g. may have a portion that directly contacts, one surface of the first pinned pattern 120, and the first pinned pattern 120 may have a perpendicular magnetization property by magnetic anisotropy induced by a junction of the exchange coupling pattern 130 and the first pinned pattern 120. Even though not shown in the drawings, an additional non-magnetic pattern may be disposed between the top electrode TE and the first pinned pattern 120. The additional non-magnetic pattern may include at least one of, for example, iridium (Ir) or ruthenium (Ru). In this case, the first pinned pattern 120 may have a perpendicular magnetization property by magnetic anisotropy induced by a junction of the additional non-magnetic pattern and the first pinned pattern 120 and/or the junction of the exchange coupling pattern 130 and the first pinned pattern 120.

Except for the differences described above, other components and features of the magnetic memory device according to the present embodiments may be substantially the same as corresponding components and features of the magnetic memory device described with reference to FIGS. 3 and 4.

Figure 10:
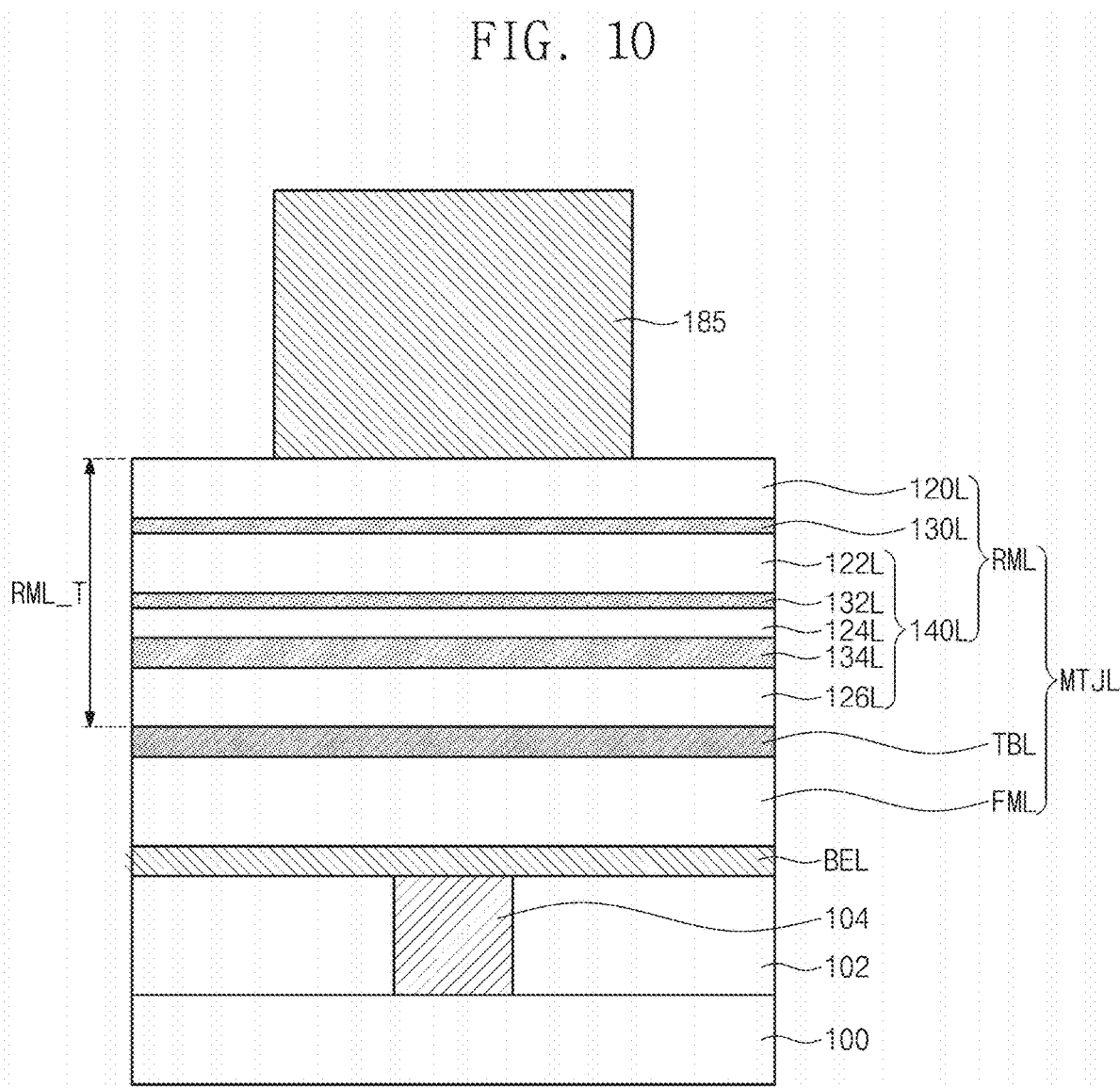
FIGS. 10 and 11 are cross-sectional views illustrating a method of manufacturing a magnetic memory device, according to some example embodiments of inventive concepts.
Figure 11:
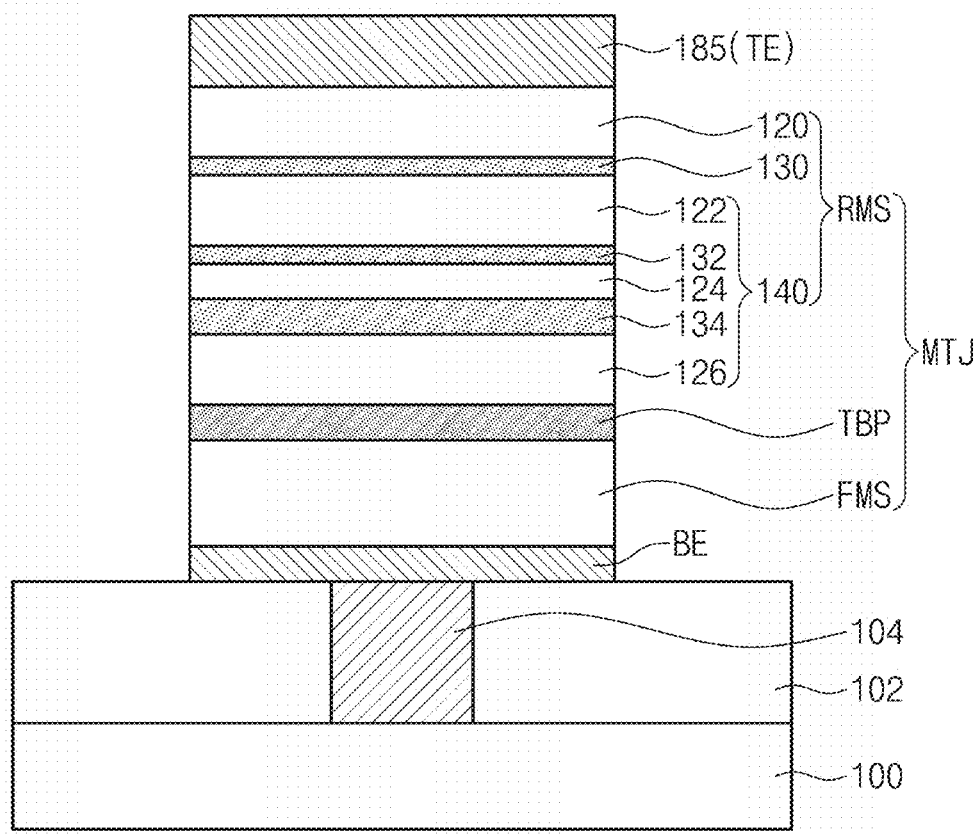

FIGS. 10 and 11 are cross-sectional views illustrating a method of manufacturing a magnetic memory device, according to some example embodiments of inventive concepts. Hereinafter, differences between the present embodiments and the above embodiments described with reference to FIGS. 6 and 7 will be mainly described for the purpose of ease and convenience in explanation.

Referring to FIG. 10, the bottom electrode layer BEL may be formed on the lower interlayer insulating layer 102. The free magnetic layer FML and the tunnel barrier layer TBL may be sequentially formed on the bottom electrode layer BEL. The free magnetic layer FML may be disposed between the bottom electrode layer BEL and the tunnel barrier layer TBL.

The reference magnetic layer RML may be formed on the tunnel barrier layer TBL. The formation of the reference magnetic layer RML may include sequentially depositing the second pinned layer 140L, the exchange coupling layer 130L, and the first pinned layer 120L on the tunnel barrier layer TBL. The depositing of the second pinned layer 140L may include sequentially depositing the polarization enhancement magnetic layer 126L, the second non-magnetic layer 134L, the second ferromagnetic layer 124L, the first non-magnetic layer 132L, and the first ferromagnetic layer 122L on the tunnel barrier layer TBL.

The reference magnetic layer RML, the tunnel barrier layer TBL and the free magnetic layer FML may constitute, or be included in, the magnetic tunnel junction layer MTJL. The conductive mask pattern 185 may be formed on the magnetic tunnel junction layer MTJL. The conductive mask pattern 185 may be formed on the first pinned layer 120L of the reference magnetic layer RML.

Referring to FIG. 11, an etching process for etching the magnetic tunnel junction layer MTJL may be performed using the conductive mask pattern 185 as an etch mask. The magnetic tunnel junction layer MTJL and the bottom electrode layer BEL may be sequentially etched by the etching process to form the magnetic tunnel junction pattern MTJ and the bottom electrode BE. The magnetic tunnel junction pattern MTJ may include the free magnetic structure FMS, the tunnel barrier pattern TBP, and the reference magnetic structure RMS, which are sequentially stacked on the bottom electrode BE. A portion of the conductive mask pattern 185 may remain on the magnetic tunnel junction pattern MTJ after the etching process, and the remaining portion of the conductive mask pattern 185 may function as the top electrode TE. Except for the arrangement of the free and reference magnetic structures FMS and RMS, other processes and/or features of the manufacturing methods according to example embodiments may be substantially the same as corresponding processes and/or features of the manufacturing method described with reference to FIGS. 6 and 7.

According to the embodiments of inventive concepts, the reference magnetic structure of the magnetic tunnel junction pattern may include the first pinned pattern, the second pinned pattern, and the exchange coupling pattern therebetween. The first pinned pattern may be a ferromagnetic pattern consisting of (or formed of), or consisting essentially of, or including, a ferromagnetic element and may not include a non-magnetic element. Accordingly, the first pinned pattern may have a stable perpendicular magnetization property, and a surface roughness of the first pinned pattern may be reduced. Thus, magnetic properties (e.g., an exchange magnetic field (Hex) and/or a switching property) of the magnetic tunnel junction pattern may be improved. As a result, the magnetic memory device with improved or excellent characteristics may be provided.

The deposition process for forming the first pinned pattern may be performed at room temperature. In addition, the first pinned pattern may be formed of a single layer consisting of (or made of), or consisting essentially of, or including, a ferromagnetic element, and thus a thickness of the reference magnetic structure may be reduced. As a result, a process margin of the etching process for forming the magnetic tunnel junction pattern may be improved. Thus, the magnetic memory device may be easily or more easily mass-produced/fabricated.

While inventive concepts have been described with reference to example embodiments, it will be apparent to those of ordinary skill in the art that various changes and modifications may be made without departing from the spirits and scopes of inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A magnetic memory device comprising:
a reference magnetic structure including a first pinned pattern, a second pinned pattern including magnetic patterns and non-magnetic patterns, which are alternately stacked, and an exchange coupling pattern between the first pinned pattern and the second pinned pattern, the first pinned pattern directly contacting a seed pattern and the exchange coupling pattern;
a free magnetic structure; and
a tunnel barrier pattern between the reference magnetic structure and the free magnetic structure,
wherein the second pinned pattern is between the first pinned pattern and the tunnel barrier pattern,
the first pinned pattern is a ferromagnetic pattern, the ferromagnetic pattern consisting of a single ferromagnetic element,
wherein the magnetic patterns include,
a first ferromagnetic pattern between the exchange coupling pattern and the tunnel barrier pattern, and
a second ferromagnetic pattern between the first ferromagnetic pattern and the tunnel barrier pattern, and
wherein the non-magnetic patterns include,
a first non-magnetic pattern between the first ferromagnetic pattern and the second ferromagnetic pattern,
wherein the exchange coupling pattern anti-ferromagnetically couples the first ferromagnetic pattern to the first pinned pattern,
wherein each of the first pinned pattern and the first ferromagnetic pattern have a thickness in a direction perpendicular to an interface between the tunnel barrier pattern and the free magnetic structure, and
wherein the thickness of the first pinned pattern is greater than or equal to the thickness of the first ferromagnetic pattern.

2. The magnetic memory device of claim 1, wherein the first pinned pattern is a single layer including the ferromagnetic element.

3. The magnetic memory device of claim 1, wherein the first pinned pattern does not include a non-magnetic element.

4. The magnetic memory device of claim 1,
wherein the second ferromagnetic pattern has a thickness in the direction perpendicular to the interface between the tunnel barrier pattern and the free magnetic structure, and
wherein the thickness of the first pinned pattern is greater than the thickness of the second ferromagnetic pattern.

5. The magnetic memory device of claim 4, wherein the thickness of the first ferromagnetic pattern is greater than the thickness of the second ferromagnetic pattern.

6. The magnetic memory device of claim 1, wherein the first non-magnetic pattern anti-ferromagnetically couples the second ferromagnetic pattern to the first ferromagnetic pattern.

7. The magnetic memory device of claim 1, wherein a ferromagnetic material included in the first ferromagnetic pattern is the same as a ferromagnetic material included in the first pinned pattern.

8. The magnetic memory device of claim 1, wherein a ferromagnetic material included in the second ferromagnetic pattern is the same as the ferromagnetic material included in the first pinned pattern.

9. The magnetic memory device of claim 1, wherein the magnetic patterns further include,
a polarization enhancement magnetic pattern between the second ferromagnetic pattern and the tunnel barrier pattern,
wherein the non-magnetic patterns further include,
a second non-magnetic pattern between the second ferromagnetic pattern and the polarization enhancement magnetic pattern,
wherein the second non-magnetic pattern ferromagnetically couples the polarization enhancement magnetic pattern to the second ferromagnetic pattern.

10. The magnetic memory device of claim 9, wherein the first non-magnetic pattern anti-ferromagnetically couples the second ferromagnetic pattern to the first ferromagnetic pattern.

11. The magnetic memory device of claim 9, wherein the first non-magnetic pattern includes a non-magnetic element that is not included from among the non-magnetic elements included in the second non-magnetic pattern.

12. The magnetic memory device of claim 1,
wherein the first pinned pattern is between the seed pattern and the exchange coupling pattern, and
wherein the seed pattern includes a portion that contacts one surface of the first pinned pattern.

13. The magnetic memory device of claim 12, wherein the seed pattern comprises:
a first sub-pattern; and
a second sub-pattern between the first sub-pattern and the first pinned pattern and having a portion in contact with the first pinned pattern,
wherein at least a portion of the first sub-pattern is amorphous.

14. A magnetic memory device comprising:
a reference magnetic structure including a first pinned pattern, a second pinned pattern including magnetic patterns and non-magnetic patterns, which are alternately stacked, and an exchange coupling pattern between the first pinned pattern and the second pinned pattern;
a free magnetic structure;
a tunnel barrier pattern between the reference magnetic structure and the free magnetic structure; and
a seed pattern spaced apart from the tunnel barrier pattern with the reference magnetic structure interposed therebetween, wherein the second pinned pattern is between the first pinned pattern and the tunnel barrier pattern, the first pinned pattern is a single layer consisting of a single ferromagnetic element, a surface of the first pinned pattern directly contacts the seed pattern and an opposite surface of the first pinned pattern directly contacts the exchange coupling pattern, and wherein the magnetic patterns comprise:

a first ferromagnetic pattern between the exchange coupling pattern and the tunnel barrier pattern, and wherein the exchange coupling pattern anti-ferromagnetically couples the first ferromagnetic pattern to the first pinned pattern.

15. The magnetic memory device of claim 14, wherein each of the first pinned pattern and the first ferromagnetic pattern have a thickness in a direction perpendicular to an interface between the tunnel barrier pattern and the free magnetic structure, and wherein the thickness of the first pinned pattern is greater than or equal to the thickness of the first ferromagnetic pattern.

16. The magnetic memory device of claim 15, wherein a ferromagnetic material included in the first ferromagnetic pattern is the same as a ferromagnetic material included in the first pinned pattern.

17. The magnetic memory device of claim 14, wherein the magnetic patterns further include, a second ferromagnetic pattern between the first ferromagnetic pattern and the tunnel barrier pattern, wherein the non-magnetic patterns include, a first non-magnetic pattern between the first ferromagnetic pattern and the second ferromagnetic pattern, and wherein the first non-magnetic pattern anti-ferromagnetically couples the second ferromagnetic pattern is to the first ferromagnetic pattern.

\* \* \* \* \*